(12) United States Patent
Minter et al.

(10) Patent No.: US 6,255,035 B1
(45) Date of Patent: Jul. 3, 2001

(54) METHOD OF CREATING OPTIMAL PHOTORESIST STRUCTURES USED IN THE MANUFACTURE OF METAL T-GATES FOR HIGH-SPEED SEMICONDUCTOR DEVICES

(75) Inventors: Jason P. Minter, San Diego, CA (US); John R. Lee, Plano, TX (US)

(73) Assignee: Electron Vision Corporation, San Diego, CA (US)

( * ) Notice: Subject to any disclaimer, the term of this patent is extended or adjusted under 35 U.S.C. 154(b) by 0 days.

(21) Appl. No.: 09/270,535

(22) Filed: Mar. 17, 1999

(51) Int. Cl.[7] .............................. G03C 5/00; H01L 21/28
(52) U.S. Cl. ..................... 430/312; 430/296; 430/315; 430/328; 438/579
(58) Field of Search ........................................ 430/312, 296, 430/315, 328, 742, 945, 967; 438/618, 578, 579

(56) References Cited

U.S. PATENT DOCUMENTS

| | | | |
|---|---|---|---|
| 4,857,481 | * 8/1989 | Tam et al. | 438/619 |
| 5,468,595 | 11/1995 | Livesay | 430/296 |
| 5,658,469 | 8/1997 | Jennison | 216/22 |
| 5,736,417 | 4/1998 | Oki et al. | 437/148 |
| 5,766,967 | 6/1998 | Lai et al. | 437/415 |
| 5,843,537 | 12/1998 | Kim et al. | 427/504 |

OTHER PUBLICATIONS

Jakobus, T.et al, "E–Beam T–Gate Technology for Pseodomorphic HEMT's on 3" —GaAs with Gate Length of 0.15 μm., GaAs Mantech, 1998, pp. 169–172.

Leonard, Jerry, 0.25 Micron Optical T–Gate Development for GaAs Device Applications Using Chromeless Phase Shift Technology GaAs Mantech, 1998, pp. 173–176.

Hanes, L.K., "Transition of 0.15 μm T–Gates to Manufacturing". GaAs Mantech, 1998, pp. 165–168.

* cited by examiner

Primary Examiner—Shean C. Wu
(74) Attorney, Agent, or Firm—Roberts & Mercanti LLP

(57) ABSTRACT

A process for forming T-shaped metal contacts on a dielectric substrate. The process includes deposition of first and second photoresist layers onto a substrate; individually overall electron beam exposure of both layers; with subsequent imagewise UV exposure and development of both layers to form hollow cavities in the layers. By concentrating the electron beam radiation on the mid-point in the thickness of each photoresist layer, the radiation is distributed throughout each layer, resulting in solubility properties which lead to the formation of hollow cavities of a certain desired shape. In one embodiment of the invention, three-dimensional structures are formed in the photoresist layers by filling the hollow cavities with metal. Subsequent removal of unwanted portions of the photoresist layers produces a dielectric substrate having T-shaped metal contacts on its surface.

21 Claims, 7 Drawing Sheets

METHOD OF CREATING OPTIMAL PHOTORESIST STRUCTURES USED IN THE MANUFACTURE OF METAL T-GATES FOR HIGH-SPEED SEMICONDUCTOR DEVICES

BACKGROUND OF THE INVENTION

1. Field of the Invention

The present invention relates to semiconductor devices. More specifically, the invention relates to the formation of submicron size T-shaped metal contacts on substrates.

2. Description of the Prior Art

The art of forming images for the production of microelectronic devices is well known. In this regard, photoresist compositions are widely used image forming compositions for microelectronic device manufacturing processes. Generally, in these processes a thin coating of a radiation sensitive photoresist composition is first applied to a substrate material. The coated substrate is then treated to evaporate solvents in the photoresist composition and to fix the coating onto the substrate. The coated surface of the substrate is next typically subjected to an imagewise exposure to actinic radiation. Actinic radiation exposure causes a chemical transformation in the exposed areas of the coated surface. Visible light, ultraviolet (LTV) light, electron beam and X-ray radiant energy are radiation types commonly used in microlithographic processes. After imagewise exposure, the coated substrate is contacted with a developer solution to dissolve and remove either the radiation exposed or unexposed areas of the coated substrate.

There are two classes of photoresist compositions, namely negative working and positive working photoresists. When negative working photoresist compositions are exposed imagewise to radiation, the areas exposed to radiation become less soluble to a developing solution while the unexposed areas of the photoresist remain relatively soluble to a developing solution. Thus, treatment of an exposed negative working resist with a developer causes removal of the non-exposed areas of the resist coating thereby uncovering a desired portion of the underlying substrate surface on which the photoresist composition was deposited. When positive working photoresist compositions are exposed imagewise to radiation, those areas exposed to the radiation become more soluble to the developer solution while unexposed areas remain relatively insoluble to the developer solution. Thus, treatment of an exposed positive working photoresist with the developer causes removal of the exposed areas of the resist coating and the creation of a positive image in the photoresist coating. In either case a desired portion of the underlying substrate surface remains uncovered. Positive working photoresist compositions are favored over negative working resists because the former generally have better resolution characteristics.

Imaging processes may be additive or subtractive. Subtractive processes entail an etching away of a material using dry plasma, a chemical solution, or an ion beam. In a subtractive process a substrate is coated with a resist and the resist layer is then imagewise exposed to radiation in order to chemically change the resist in the exposed areas. The resist is next immersed in a solvent, which dissolves away the nonimage region, leaving the desired image. The resist layer then acts as a protective mask for the subsequent etching away of the material in the layer to be patterned. Remaining portions of the resist layer are then stripped away in a solvent, leaving the desired image. Additive processes are those where material is deposited after the resist has been patterned. In an additive or so called "lift-off" process, a metal is deposited after resist patterning and then the resist is stripped off, leaving metal in the open areas of the resist. In such a process, a substrate is coated with a resist layer which is then exposed and developed to dissolve away the nonimage areas. A metal or other material to be patterned is deposited on top of the resist layer, such that the metal or other material adheres to the substrate in the patterned regions. The resist layer is then removed, carrying away the metal layer everywhere except in the patterned regions.

Various techniques have been developed to control the edge profile of resist images in such additive processes. Vertical wall profiles are used in some etching processes, while others require a tapered edge slope. Typically, however, changing the image wall slope requires additional processing steps and multiple resist layers, which significantly adds to the complexity and cost of fabrication. Additional processing steps used to achieve undercut profiles or vertical side walls often decrease the overall manufacturing yield of the devices. It would therefore be highly desirable to have a means for creating resist images having desired shapes and profiles which could be developed easily without sacrificing manufacturing yield. While many skilled in the art have devised processing means to control these shapes, prior art techniques add complexity to the fabrication process by requiring additional steps. Such additional complexity tends to reduce overall process yields. For lift-off additive processes, an undercut resist profile is desired to provide a clean discontinuity of the deposited metal layer.

When the gate-length of submicron size devices is decreased below 0.5 $\mu$m, it is difficult to fabricate the device by using a conventional UV exposure system. One of the solutions is the use of electron beam lithography systems. To make a gate with a rectangular cross section, a single-layer photoresist can be used, and an electron beam lithography system may be used for exposure. However, the cross sectional area of such gate is proportional to its gate-length. As a result, the gate resistance increases with decreasing gate-length. To increase the cross sectional area of a gate so as to reduce the gate resistance and to improve the performance of the device, one commonly used method is to adopt a bi-layer photoresist structure which includes a low/high photoresist structure, PMMA/P(MMA-MAA), to form a mushroom gate. That is, a positive photoresist PMMA (poly methyl methacrylate) that has the low (electron beam) sensitivity and high resolution is combined with a P(MMA-MAA) photoresist (poly methyl methacrylate-methacrylic acid) that has high (electron beam) sensitivity to form a bi-layer photoresist. The bi-layer photoresist can form openings of different line widths at the PMMA layer and the P(MMA-MAA) layer after electron beam exposures and development. In such a process, epitaxial layers are grown on a substrate, then the first photoresist layer is spun on the epitaxial layers. A second photoresist layer is spun on top of the first photoresist layer. The two photoresist layers are respectively imagewise exposed by electron beam lithography, and the exposed areas of the first photoresist layer and the second photoresist layer are formed with different linewidths. The two photoresist layers are developed by a developer, so that an opening is formed which consists of different linewidths of openings formed at the first photoresist layer and the second photoresist layer respectively. Metal layers are evaporated thereon. The wafer is soaked in a solvent to remove the remaining photoresist, lift off a portion of the metal layers and form a T-gate with a mushroom shape. This approach requires two imagewise e-beam exposures. Therefore it is quite expensive and time-consuming. Further, the evaporated metal is difficult to lift off since the metal layers evaporated on the photoresist and the metal layers filled in the opening are connected together.

U.S. Pat. No. 5,766,967 teaches a method for fabricating a submicron T-shaped gate for field-effect transistors. This method uses a tri-layer positive photoresist with a single electron beam exposure and a single development step. The method comprises the steps of growing epitaxial layers on a semiconductor substrate; sequentially coating a first photoresist layer, a second photoresist layer and a third photoresist layer on the top of epitaxial layers, exposing the gate regions of the photoresist layers by a single electron beam exposure; and developing all the exposed positions of the three photoresist layers by a single development step, so that a T-shaped opening is formed. After etching and removing a contact layer of the epitaxial layers under the T-shaped opening, evaporating gate metal layers to cover the third photoresist layer and to fill the T-shaped opening, and removing the photoresist layers to lift off the evaporated metal layers, a submicron T-shaped gate is obtained. However, this approach requires the use of three distinct photoresist layers.

In, Chao, P.C. et al. (IDEM digest-1983, pp. 613 to 616) there is disclosed a method of making a submicron T-gate by using a tri-layer photoresist by e-beam exposure. This technique utilized two electron beam exposures for a tri-layer photoresist. An electron beam with a larger line width and lower energy was first used to expose the second and the third photoresist layers to obtain a wider exposed region, followed by a second electron beam exposure with a smaller line width and higher energy to form a narrow exposed region at the bottom photoresist layer. Development must be performed three times. A metal layer is evaporated thereon, and since the linewidths of openings of the second photoresist layer and the third photoresist layer are different, an overhang is formed by the remaining third photoresist layer on top of the second photoresist layer which is used for breaking the metal layers. Therefore, the metal layers evaporated on the photoresist layer can be readily lifted off. However, this system is complicated, expensive, and time-consuming, since it needs two imaging e-beam exposures and three development processes.

In optical exposure of photoresists, energy absorption is highest at the top of the resist layer and lowest at the interface between the resist and the underlying substrate, due to light attenuation in the resist. These photon or optical exposure typically result in a tapered edge profile. It is therefore ordinarily impossible to obtain an undercut profile with normal optical exposure and development of positive photoresists. The present invention takes advantage of the fact that the energy absorption in a resist layer during an overall e-beam exposure is not linear. A maximum energy absorption is reached at about one-third of the beam penetration range. This energy absorption can be controlled by setting the electron beam acceleration.

The present invention provides a solution to the aforesaid T-gate production problems by providing a process which maintains control of photoresist image shapes while maximizing yield. The process of the invention includes the use of two positive working photoresist layers of different solubilities on a substrate. Each layer is overall exposed to electron beam radiation to render each layer more soluble. The electron beam radiation is concentrated at about the mid-point in the thickness of each layer. After electron beam exposure, the layers are each UV exposed and developed, leaving behind hollow cavities which have a T-shape. These hollow cavities are then conventionally filled with a conductor material to form contacts on the surface of the substrate. By the fabrication method of the present invention, a T-shaped opening can be formed at the photoresist layers by the fabrication process to facilitate the liftoff process of the evaporated metal layers. Therefore, the cost can be reduced and the yield can be raised.

SUMMARY OF THE INVENTION

The invention provides a process for forming a photoresist image on a substrate which comprises:

a) depositing a first positive working photoresist composition onto a substrate to thereby form a first photoresist layer;

b) depositing a second positive working photoresist composition onto the first photoresist layer to thereby form a second photoresist layer; the first photoresist composition having a different solubility than the second photoresist composition;

c) overall exposing the first photoresist layer to sufficient electron beam radiation to render the first photoresist layer more soluble than prior to exposure, wherein the radiation is concentrated at about the mid-point in the thickness of the first photoresist layer;

d) overall exposing the second photoresist layer to sufficient electron beam radiation to render the second photoresist layer more soluble than prior to exposure, wherein the radiation is concentrated at about the mid-point in the thickness of the second photoresist layer;

e) conducting either step (i), (ii) or (iii):
   (i) sequentially imagewise exposing the second photoresist layer to radiation, developing the second photoresist layer; imagewise exposing the first photoresist layer to radiation; and then developing the first photoresist layer;
   (ii) simultaneously exposing both the second and the first photoresist layers to radiation; developing the second photoresist layer; and then developing the first photoresist layer;
   (iii) sequentially imagewise exposing the second photoresist layer to radiation; imagewise exposing the first photoresist layer to radiation; and then developing the second and first photoresist layers either simultaneously or sequentially;

to thereby form cavities in the second photoresist layer, such that the diameters of the cavities at an upper surface of the second photoresist layer are less than the diameters of the cavities at a lower surface of the second photoresist layer thus defining cavities having outwardly sloping negative sidewalls and to thereby form cavities in the first photoresist layer, such that the diameters of the cavities at an upper surface of the first photoresist layer are greater than the diameters of the cavities at a lower surface of the first photoresist layer thus defining cavities having inwardly sloping positive sidewalls.

The invention further provides a process for forming metal contacts on a substrate which comprises:

a) depositing a first positive working photoresist composition onto a substrate to thereby form a first photoresist layer;

b) depositing a second positive working photoresist composition onto the first photoresist layer to thereby form a second photoresist layer; the first photoresist composition having a different solubility than the second photoresist composition;

c) overall exposing the first photoresist layer to sufficient electron beam radiation to render the first photoresist layer more soluble than prior to exposure, wherein the radiation is concentrated at about the mid-point in the thickness of the first photoresist layer;

d) overall exposing the second photoresist layer to sufficient electron beam radiation to render the second photoresist layer more soluble than prior to exposure, wherein the radiation is concentrated at the about mid-point in the thickness of the second photoresist layer;

e) conducting either step (i), (ii) or (iii):
   (i) sequentially imagewise exposing the second photoresist layer to radiation, developing the second photoresist layer; imagewise exposing the first photoresist layer to radiation; and then developing the first photoresist layer;
   (ii) simultaneously exposing both the second and the first photoresist layers to radiation; developing the second photoresist layer; and then developing the first photoresist layer;
   (iii) sequentially imagewise exposing the second photoresist layer to radiation; imagewise exposing the first photoresist layer to radiation; and then developing the second and first photoresist layers either simultaneously or sequentially;

to thereby form cavities in the second photoresist layer, such that the diameters of the cavities at an upper surface of the second photoresist layer are less than the diameters of the cavities at a lower surface of the second photoresist layer thus defining cavities having outwardly sloping negative sidewalls and to thereby form cavities in the first photoresist layer, such that the diameters of the cavities at an upper surface of the first photoresist layer are greater than the diameters of the cavities at a lower surface of the first photoresist layer thus defining cavities having inwardly sloping positive sidewalls.

DETAILED DESCRIPTION OF THE PREFERRED EMBODIMENT

Figure 1:
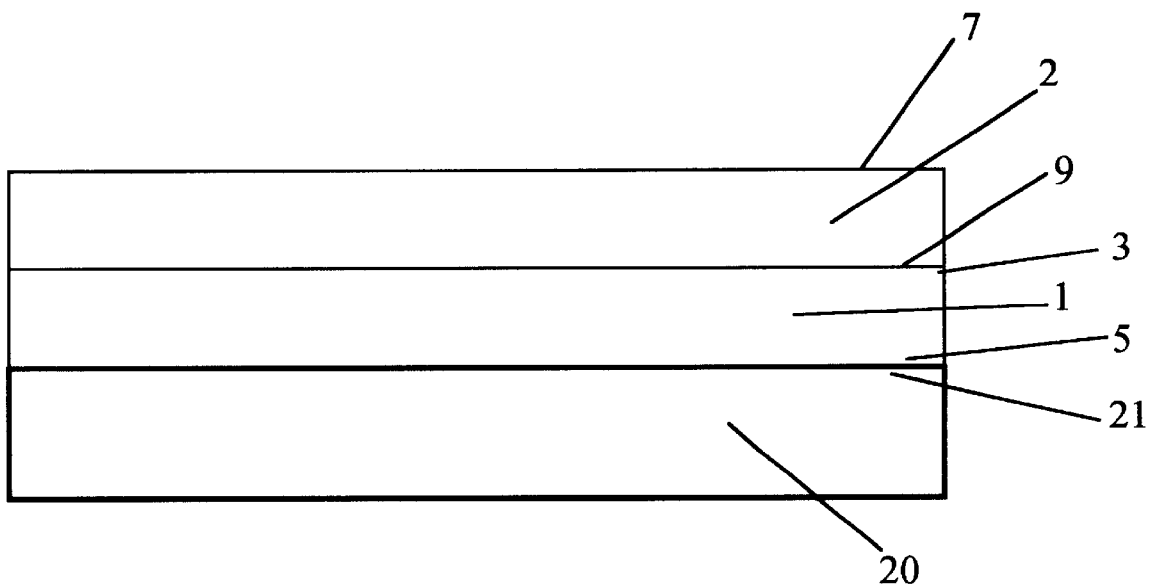
FIG. 1 shows a coated substrate having first and second photoresist layers according to the present invention.

According to the invention, a photoresist image is formed on a dielectric substrate. The substrate is coated with two different types of positive acting photoresist layers which have distinctly different solubilities. The photoresist layers are individually overall flood exposed to electron beam radiation, individually imagewise UV exposed and developed to form hollow cavities of a desired shape according to the invention. Subsequent steps may be taken to fill these hollow cavities with metal to form T-gate metal contacts on the surface of the substrate.

Photoresist compositions are themselves well known in the art and are widely commercially available. Positive working photoresists include any compositions or polymers that can be solubilized or degraded as a result of irradiation with an electron beam or ultraviolet light.

According to the invention, first and second photoresist compositions are formed and deposited onto a suitable substrate. Suitable photoresist compositions are well known in the art and may include mixtures of o-quinone diazides with an aqueous alkali soluble or swellable binder resin such as a novolak or poly(4-hydroxystyrene). Suitable photoresists are described in U.S. Pat. Nos. 4,692,398; 4,835,086; 4,863,827 and 4,892,801. Suitable photoresists may be purchased commercially as AZ-4620, from Clariant Corporation of Somerville, N.J. Other suitable photoresists include solutions of polymethylmethacrylate (PMMA), such as a liquid photoresist available as 496 k PMMA, from OLIN HUNT/OCG of West Paterson, N.J., comprising polymethylmethacrylate with molecular weight of 496,000 dissolved in chlorobenzene (9 wt %); P(MMA-MAA) (poly methyl methacrylate-methacrylic acid); and PMMA/P(MMA-MAA) polymethylmethacrylate/(poly methyl methacrylate-methacrylic acid). Each of the first and second photoresists may comprises any of these materials or analogous materials provided the selected first and second photoresists have different solubilities in developer compositions. That is, the developer for the first photoresist does not dissolve the second photoresist in the exposed or unexposed areas and vice versa.

The first positive working photoresist composition preferably comprises an acrylic polymer such as PMMA, P(MMA-MAA) and PMMA/P(MMA-MAA). Polymethyl methacrylate is an acrylic polymer which is extensively used in the industry. Polymethyl methacrylate is known for its clarity, surface hardness, U.V. resistance and generally good weatherability and chemical resistance. PMMA is commonly used as component of a resist in photolithographic processes for the fabrication of integrated circuits. PMMA is readily commercially available from Aldrich Chemical Company of Milwaukee, Wis.

In a preferred embodiment, the second positive working photoresist composition preferably comprises a solution of a novolak resin, a quinone diazide photosensitizer, and a compatible solvent composition. The production of novolak resins is well known in the art and such resins are more fully described in U.S. Pat. No. 4,692,398. Suitable quinone diazide photosensitizers include o-quinone diazides such as naphthoquinone diazide sensitizers which are conventionally used in the art in positive photoresist formulations. Useful naphthoquinone diazide sensitizers include naphthoquinone-(1,2)diazide-5-sulfonyl chloride, and naphtoquinone-(1,2)-diazide-4-sulfonyl chloride condensed with phenolic compounds such as hydroxy benzophenones. These compounds are also more fully described in U.S. Pat. No. 4,692,398.

To produce the second photoresist composition of this invention, the resin and diazide components are first mixed together with a suitable solvent. The resin component of this mixture is present in an amount of from about 15% to about 99% based on the solid parts mixture, and the quinone is present in an amount of from about 1% to about 85% based on the solid parts of the mixture. This resin/diazide mixture is mixed with a suitable solvent composition. The solvent composition may comprise any suitable solvent known in the art. Preferred solvents include propylene glycol monomethylether, propylene glycol monomethylether acetate, xylene, butyl acetate and Cellosolve acetate such that the solvent comprises from about 40% to about 90% by weight of the overall resist composition. Conventional photoresist additives such as dyes, anti-striation agents, plasticizers, adhesion promoters, speed enhancers and non-ionic surfactants may optionally be added to the photoresist composition before it is deposited onto the substrate.

According to the invention, the first and second photoresist compositions must have different solubilities in their respective developers. That is, the first photoresist, both before and after exposure should be substantially insoluble in the developer for the second photoresist and the second photoresist, both before and after exposure should be substantially insoluble in the developer for the first photoresist.

Suitable developers for novolak resin/diazide photoresists are aqueous alkaline solutions. Typical examples of the aqueous alkaline solutions suitable as the developer include sodium hydroxide, tetramethylammonium hydroxide, or aqueous solutions of hydroxides of metals belonging to the groups I and II of the periodic table such as potassium hydroxide or an aqueous solution of organic bases free from metal ions such as tetraalkylammonium hydroxide, for example, tetramethylammonium hydroxide (TMAH), tetraethylammonium hydroxide (TEAM) and tetrabutylammonium hydroxide (TBAH). More preferably, a metal ion free tetramethylammonium hydroxide (TMAH) is used as the developer. Furthermore, if desired, the aqueous basic solution used as the developer may additionally contain any additives such as a surface active agent in order to improve the resulting development effect. Examples of an aqueous alkaline developer include AZ 400K alkaline developer or AZ 312 MIF alkaline developer available from Clariant Corporation of Somerville, N.J. Suitable developer for acrylate photoresists such as PMMA photoresists include methylisobutyl ketone and xylene.

As shown in FIG. 1 of the present invention, first and second photoresist compositions are deposited onto a suitable substrate 20 to thereby form first and second photoresist layers 1 and 2 respectively on the substrate 20. Deposition may be conducted via conventional spin-coating, dip coating, roller coating, spraying, chemical vapor deposition methods, or meniscus coating methods which are well-known in the art. Spin coating is most preferred. In a preferred embodiment of the invention, the first photoresist layer 1 is formed by centrally applying a liquid first photoresist composition to an upper surface 21 of the substrate 20 and then spinning the substrate 20 on a rotating wheel (not shown) at speeds ranging from about 500 to about 6000 rpm, preferably from about 1500 to about 4000 rpm, for about 5 to about 60 seconds, preferably from about 10 to about 30 seconds, in order to spread the composition evenly across the upper surface 21. This first photoresist composition is then dried and/or cured onto the substrate 20 by conventional means such as hotplate softbaking to form the first photoresist layer 1 on the substrate 20.

The second photoresist layer 2 is then applied to the first photoresist layer 1 by centrally applying a liquid second photoresist composition onto an upper surface 3 of first photoresist layer 1 and then spinning the substrate 20 on a rotating wheel (not shown) in order to spread the composition evenly across the upper surface 3 of the first photoresist layer 1. This spinning is preferably conducted at speeds and times within the ranges used for the first photoresist layer. This second photoresist composition is then dried and/or cured onto the first photoresist layer 1 by conventional means such as hotplate softbaking to form a second photoresist layer 2 on the first photoresist layer 1.

The thicknesses of the first and second photoresist layers may vary depending on the amount of liquid first and second photoresist compositions that are applied, but typically the thicknesses may range from about 500 Å to about 50,000 Å, and preferably from about 2000 Å to about 12000 Å. The amount of photoresist compositions applied may vary from about 1 ml to about 10 ml, and preferably from about 2 ml to about 8 ml depending on the size of the substrate.

Typical substrates include those suitable to be processed into an integrated circuit or other microelectronic device. Suitable substrates for the present invention non-exclusively include semiconductor materials such as gallium arsenide (GaAs), germanium, silicon and compositions containing silicon such as crystalline silicon, polysilicon, amorphous silicon, epitaxial silicon, and silicon dioxide ($SiO_2$), lithium niobate ($LiNb_3$) and mixtures thereof Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

Figure 2:
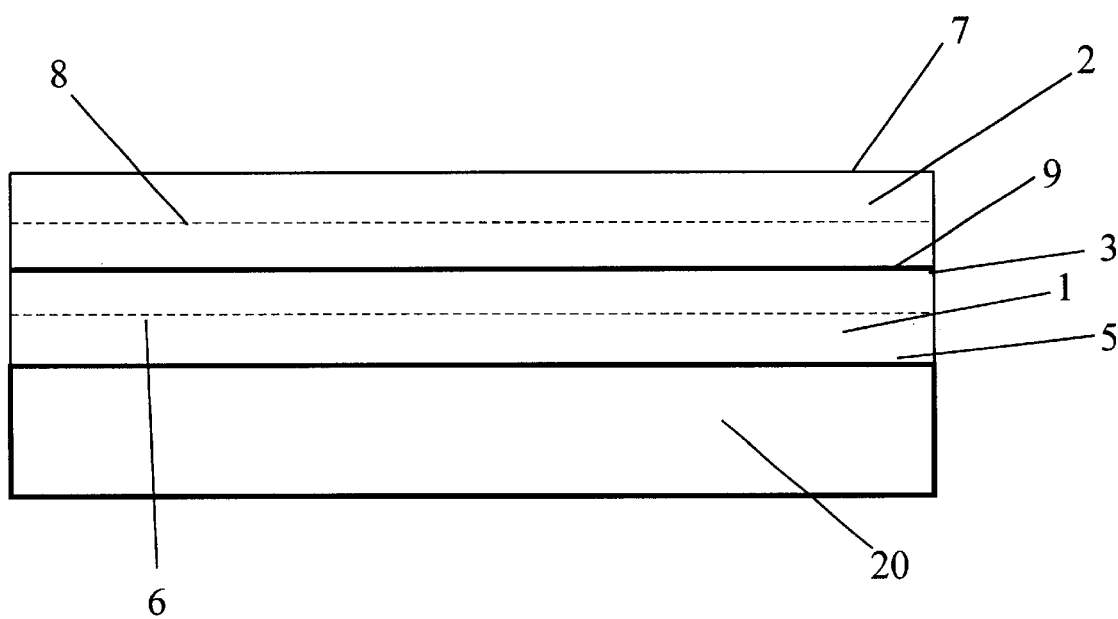
FIG. 2 shows a coated substrate having first and second photoresist layers according to the present invention, each layer having a midpoint in its thickness where electron beam radiation is concentrated.

After deposition onto the substrate, overall flood electron beam exposure (not imagewise) of each of the photoresist layers is separately performed. This exposure renders the photoresist layers more soluble after exposure than prior to exposure. FIG. 2 shows the substrate 20 coated with a first photoresist layer 1 and a second photoresist layer 2. According to the FIG. 2, the second photoresist layer 2 has an upper surface 7, a lower surface 9, and a mid-point 8 in the thickness of the layer 2. FIG. 2 also shows a first photoresist layer 1 having an upper surface 3, a lower surface 5, and a mid-point 6 in the thickness of the layer 1. According to the process of the invention, the first photoresist layer 1 is overall exposed to sufficient electron beam radiation to solubilize the layer. Electron beam exposure may be controlled by setting the beam acceleration, however, such exposure is not uniform throughout the layers, rather they have a Gaussian dose distribution about a focus line. Preferably the radiation is concentrated at approximately the mid-point 6 in the thickness of the layer to thereby cause a gradient polymer solubility distribution throughout the layer 1 between surfaces 3 and 5. The second photoresist layer 2 is then similarly overall exposed to electron beam radiation in the same manner, such that the radiation is concentrated at about the mid-point 8 in the thickness of the layer 2 layer to thereby cause a gradient polymer solubility distribution throughout the layer 2 between surfaces 7 and 9.

Electron beam radiation may take place in any chamber having a means for providing electron beam radiation to substrates placed therein. Preferably, an electron beam chamber is used which provides a large area electron source. Suitable electron beam chambers are commercially available from Electron Vision™, a unit of AlliedSignal Inc., under the trade name "ElectronCure™". The principles of operation and performance characteristics of such device are described in U.S. Pat. No. 5,001,178, the disclosure of which is incorporated herein by reference. The temperature of the electron beam exposure preferably ranges from about 20° C. to about 450° C., more preferably from about 50° C. to about 400° C. The electron beam energy is preferably from about 1 to about 30 KeV, and more preferably from about 3 to about 10 KeV. The dose of electrons is preferably from about 1 $\mu C/cm^2$ to about 50,000 $\mu C/cm^2$ more preferably from about 500 $\mu C/cm^2$ to about 50,000 $\mu C/cm^2$ and most preferably from about 3,000 $\mu C/cm^2$ to about 20,000 $\mu C/cm^2$. The gas ambient in the electron beam tool can be any of the following gases: nitrogen, oxygen, hydrogen, argon, helium, ammonia, silane, xenon or any combination of these gases. The electron beam current is preferably from about 1 to about 40 mA, and more preferably from about 5 to about 20 mA. The end result of the electron beam treatment will be photoresist layers which are more soluble in their respective developers after exposure than prior to exposure.

After electron beam exposure, the second photoresist layer is imagewise exposed to UV radiation in an amount and at a wavelength sufficient to render the exposed portions of the second photoresist layer imagewise soluble in a suitable developer. Exposure doses of from about 100 $mJ/cm^2$ to about 300 $mJ/cm^2$ are usually sufficient.

The imagewise exposed second photoresist layer is then developed with a developer solution in accordance with any conventional method such as immersion in the developer and agitation with nitrogen bursts. Treatment of the exposed positive-working photoresist with the developer causes removal of the exposed areas of the coating and the creation of a positive image in the photoresist coating. The exposed layer is immersed in a suitable developing solution until all or substantially all of the second photoresist layer has dissolved from the exposed areas.

Figure 3:
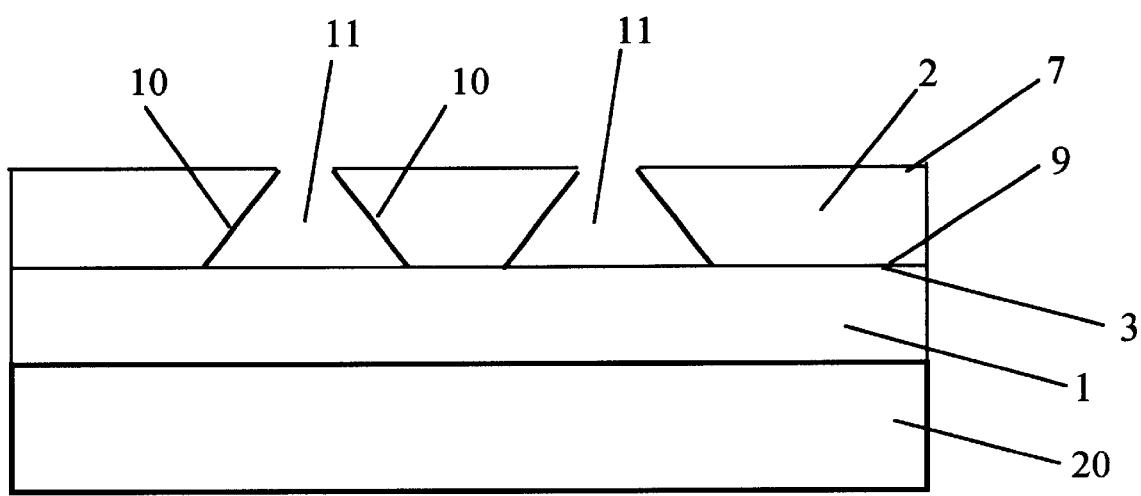
FIG. 3 shows a coated substrate according to the present invention where the second photoresist layer has been imagewise UV exposed and developed.

As shown in FIG. 3, this imagewise UV exposure and development is conducted under conditions sufficient to form hollow cavities 11 in the second photoresist layer 2. Preferably, these hollow cavities 11 extend through the entire second photoresist layer 2, revealing the upper surface 3 of the first photoresist layer 1. In the most preferred embodiment, these hollow cavities 11 have outwardly sloping sidewalls 10 such that the cavity diameters at an upper surface 7 of the second photoresist layer 2 are less than the cavity diameters at a lower surface 9 of the layer 2. Thus, the cavities are narrow at the upper surface 7 of the layer 2, and gradually widen as they approach the lower surface 9 of the layer 2.

Figure 4:
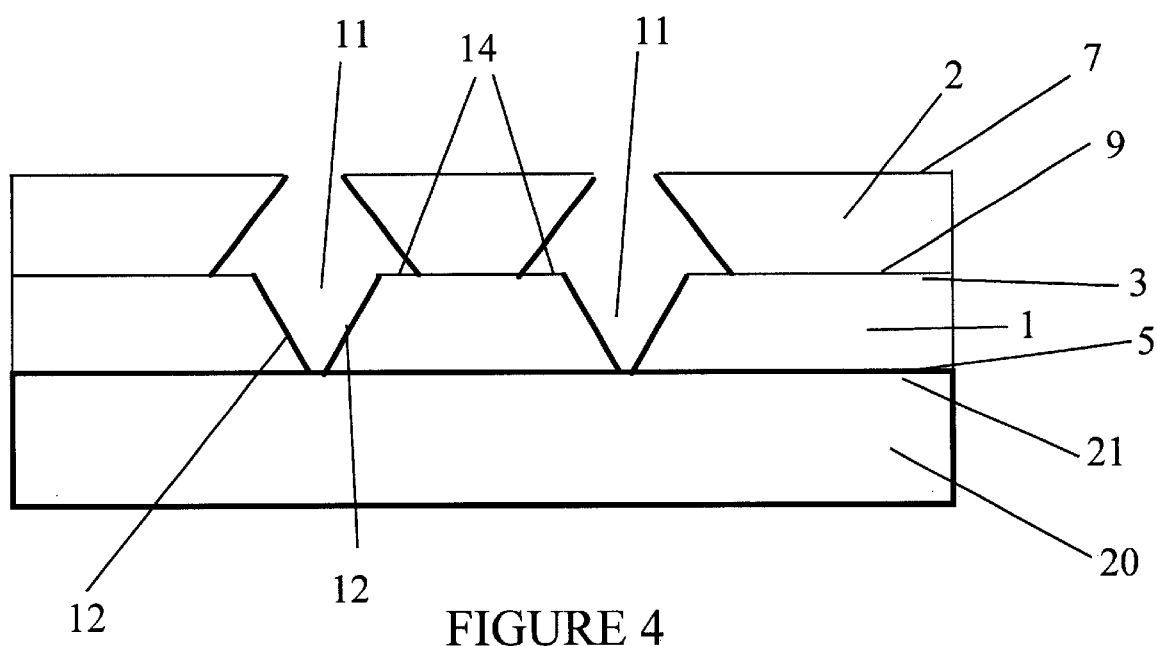
FIG. 4 shows a coated substrate according to the present invention where both the first and second photoresist layers have been imagewise UV exposed and developed.

The first photoresist layer 1 is then imagewise UV exposed and developed in a similar same manner as the second photoresist layer 2. As shown in FIG. 4, hollow cavities 11 are formed in the first photoresist layer 1. Formation of the hollow cavities 11 cause an upper surface 21 of the dielectric substrate 20 to be revealed. These hollow cavities 11 have inwardly sloping sidewalls 12 such that the cavity diameters at an upper surface 3 of the first photoresist layer 1 are greater than the cavity diameters at a lower surface 5 of the layer 1. Thus, the cavities 11 are wider at the upper surface 3 of the layer 1, and gradually become more narrow as they approach the lower surface 5 of the layer 1. In the most preferred embodiment of the invention, the diameters of the cavities at the lower surface 9 of the second photoresist layer 2 are greater than the diameters of the cavities at the upper surface 3 of the first photoresist layer 1. This forms a ledge 14 at the upper surface 3 of the first photoresist layer 1.

Figure 5:
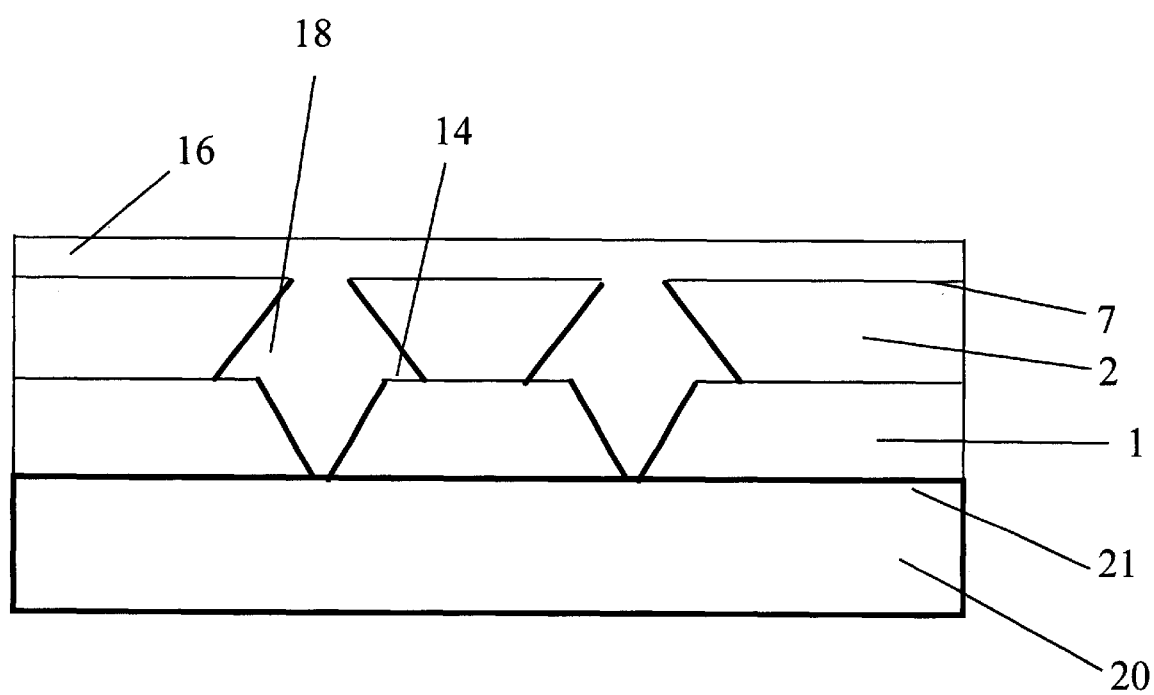
FIG. 5 shows a coated substrate according to the present invention where a metal has coated the second photoresist layer and filled the hollow cavities formed in the first and second photoresist layers.
Figure 6:
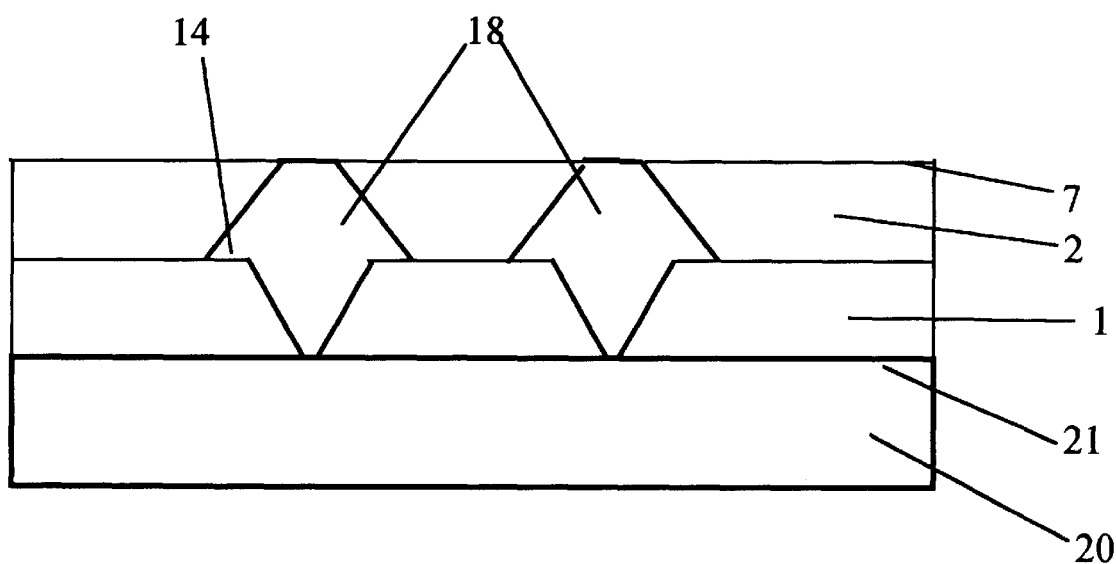
FIG. 6 shows a coated substrate according to the present invention where the metal has been stripped away from the surface of the second photoresist layer, leaving metal contacts inside the cavities.
Figure 7:
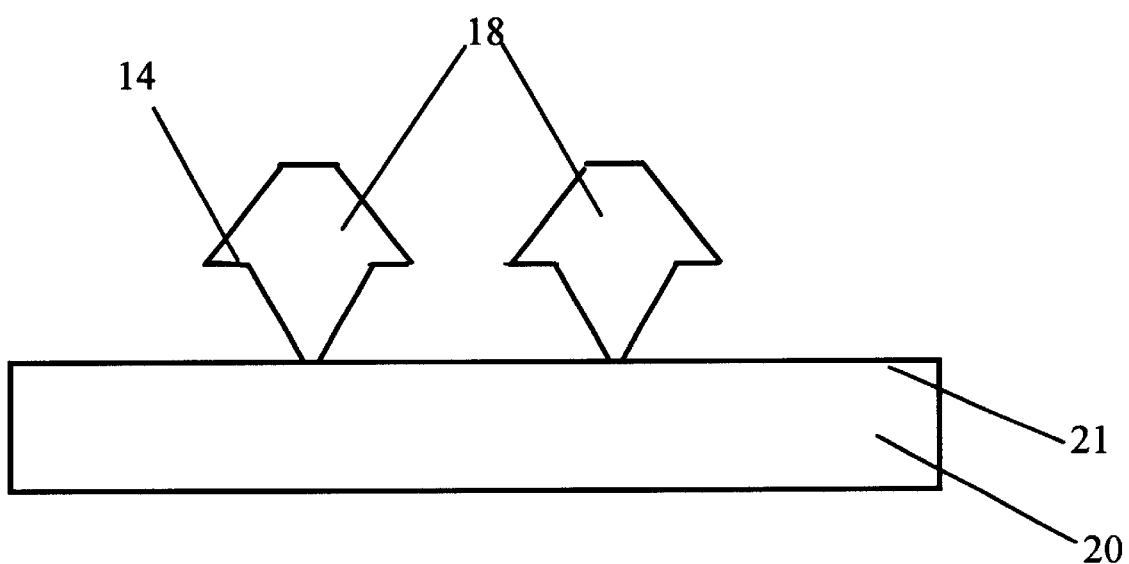
FIG. 7 shows a substrate according to the present invention where all remaining areas of the first and second photoresist layers have been removed, leaving behind the metal contacts on the substrate.

In the formation of T-gate metal contacts, a layer of metal 16 is deposited onto the second photoresist layer 2 as shown in FIG. 5. A metal 16 is deposited on the upper surface 7 of the second photoresist layer 2, and fills the cavities 11 in the first and second photoresist layers 1 and 2 respectively), forming metal contacts 18. Suitable metals include aluminum, aluminum alloys, copper, copper alloys, tantalum, tungsten, titanium or other metal typically employed in the formation of microelectronic devices. Such may be applied by such techniques as vapor deposition, sputtering, evaporation and the like. The thickness of the metal layers is preferably from about 3000 to 5000 Angstroms. As shown in FIG. 6, the metal 16 is then stripped or lifted off the top photoresist surface. By soaking the overall construction in a solvent such as acetone, both the balance of metal layer on top of the photoresist can be lifted off since the photoresist layers can be dissolved in acetone. Such dissolution of the photoresists facilitates the metal liftoff, so that a well-defined submicron T-gate can be obtained by leaving behind the metal contacts 18 on the upper surface 21 of the substrate 20 as shown in FIG. 7.

The following non-limiting examples serve to illustrate the invention.

EXAMPLE 1

A photoresist, namely PMMA 496 k is spin coated onto a silicon substrate at 3800 RPM and soft baked at 170° C. for 1 hour to obtain a thickness of 3,400 Å. Another photoresist, namely, PMMA/MAA is then spin coated at 3,400 RPM to obtain a thickness of 3,400 Å on top of the 496 k PMMA and baked for 1 hour at 170° C. The resulting bi-layer film stack was 6,800 Å thick.

Using the Grun range($R_g$) calculation ($R_g$=(0.046/d) $V_a^{1.75}$ where d=photoresist density) for electrons traveling through photoresist, a 2 step electron beam flood exposure was calculated to place a soluble dose at the mid-point in each of the photoresist layers previously coated. The first step was 5.0 keV/1 ma/75 $\mu C/cm^2$ dose. The second step was 3.0 keV/1 ma/75 $\mu C/cm^2$ dose. The 2 step EB flood exposure of the photoresist was done on the Electron Cure 30™ tool available from AlliedSignal Inc. Of San Diego, Calif.

Following the electron beam flood exposure, a gate level exposure was performed using a Cambridge EBMF 10.5 direct write Electron Beam Pattern Generator using a dose of 180 $\mu C/cm^2$ at 20 KeV energy to image the entire photoresist stack.

Following the electron beam imaging exposure, the resist stack was developed for 2 minutes in a 1:2 mixture of isopropyl alcohol (IPA) and methyl isobuthyl ketone (MIBK) to produce the desired tapered opening in the bottom layer of PMMA and undercut in the top layer of PMMA desirable for metal deposition in the manufacture of T-gate structures.

EXAMPLE 2

A photoresist, namely PEA 496 k is spin coated onto a silicon substrate at 3800 RPM and soft baked at 170° C. for 1 hour to obtain a thickness of 3,400 Å. Another photoresist, namely PMMA/MAA is then spin coated at 3,400 RPM to obtain a thickness of 3,400 Å on top of the 496 k PMMA and baked for 1 hour at 170° C. The resulting bi-layer film stack was 6,800 Å thick.

Using the Grun range ($R_g$) calculation ($R_g$=(0.046/d) $V_a^{1.75}$ where d=photoresist density) for electrons traveling through photoresist, a 2 step electron beam flood exposure was calculated to place a soluble dose at the mid-point in each of the photoresist layers previously coated. The first step was 5.0 keV/1 ma/75 $\mu$C/cm$^2$ dose. The second step was 3.0 keV/1 ma/75 $\mu$C/cm$^2$ dose. The 2 step EB flood exposure of the photoresist was done on the Electron Cure 30™.

Following the electron beam flood exposure, a gate level exposure was performed using a Cambridge EBMF 10.5 direct write Electron Beam Pattern Generator using a dose of 130 $\mu$C/cm$^2$ at 20 KeV energy to image the top layer of PMMA only.

Following the electron beam imaging exposure, the top layer of PMMA was developed for 1 minute in a 1:2 mixture of isopropyl alcohol (IPA) and methyl isobuthyl ketone (MIBK) to produce an open a pattern in the top layer of PMMA. A subsequent alignment and high resolution direct write electron beam exposure was performed to image the remaining PMMA (bottom layer) through the opening created in the previous imaging and development steps. A second development step for 1 minute in a 1:2 mixture of isopropyl alcohol (IPA) and methyl isobuthyl ketone (MIBK) was performed to produce a high resolution pattern in the bottom layer of PMMA. The resulting feature consisted of a tapered opening in the bottom layer of PMMA and undercut in the top layer of PMMA desirable for metal deposition in the manufacture of T-gate structures.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A process for forming a photoresist image on a substrate which comprises:
   a) depositing a first positive working photoresist composition onto a substrate to thereby form a first photoresist layer;
   b) depositing a second positive working photoresist composition onto the first photoresist layer to thereby form a second photoresist layer; the first photoresist composition having a different solubility than the second photoresist composition;
   c) overall exposing the first photoresist layer to sufficient electron beam radiation to render the first photoresist layer more soluble than prior to exposure, wherein the radiation is concentrated at a predetermined point in the thickness of the first photoresist layer;
   d) overall exposing the second photoresist layer to sufficient electron beam radiation to render the second photoresist layer more soluble than prior to exposure, wherein the radiation is concentrated a predetermined point in the thickness of the second photoresist layer;
   e) conducting either step (i), (ii) or (iii):
      (i) sequentially imagewise exposing the second photoresist layer to radiation, developing the second photoresist layer; imagewise exposing the first photoresist layer to radiation; and then developing the first photoresist layer;
      (ii) simultaneously exposing both the second and the first photoresist layers to radiation; developing the second photoresist layer; and then developing the first photoresist layer;
      (iii) sequentially imagewise exposing the second photoresist layer to radiation; imagewise exposing the first photoresist layer to radiation; and then developing the second and first photoresist layers either simultaneously or sequentially;
   thereby form cavities in the second photoresist layer, such that the diameters of the cavities at an upper surface of the second photoresist layer are less than the diameters of the cavities at a lower surface of the second photoresist layer thus defining cavities having outwardly sloping negative sidewalls and to thereby form cavities in the first photoresist layer, such that the diameters of the cavities at an upper surface of the first photoresist layer are greater than the diameters of the cavities at a lower surface of the first photoresist layer thus defining cavities having inwardly sloping positive sidewalls.

2. The process of claim 1 wherein each imagewise exposing is conducted with actinic radiation.

3. The process of claim 1 wherein the diameters of the cavities at a lower surface of the second photoresist layer are greater than the diameters of the cavities at an upper surface of the first photoresist layer.

4. The process of claim 1 wherein the first photoresist composition comprises polymethylmethacrylate and the second photoresist composition is comprises an o-quinone diazide.

5. The process of claim 1 wherein the first photoresist composition comprises an o-quinone diazide and the second photoresist composition comprises polymethylmethacrylate.

6. The process of claim 1 wherein the substrate is selected from the group consisting of gallium arsenide, germanium, silicon, compositions containing silicon, lithium niobate and mixtures thereof.

7. The process of claim 1 wherein each the electron beam exposing is conducted at an energy level ranging from about 1 to about 30 KeV.

8. The process of claim 1 wherein each the electron beam exposing is conducted at an electron dose ranging from about 500 to about 50,000 $\mu$C/cm$^2$.

9. The process of claim 1 wherein the electron beam exposing is conducted with a wide, large beam of electron beam radiation from a uniform large-area electron beam source.

10. The process of 1 wherein the electron beam exposing is conducted with a wide, large beam of electron beam radiation from a uniform large-area electron beam source which covers an area of from about 4 square inches to about 256 square inches.

11. A process for forming metal contacts on a substrate which comprises:
   a) depositing a first positive working photoresist composition onto a substrate to thereby form a first photoresist layer;
   b) depositing a second positive working photoresist composition onto the first photoresist layer to thereby form a second photoresist layer; the first photoresist composition having a different solubility than the second photoresist composition;
   c) overall exposing the first photoresist layer to sufficient electron beam radiation to render the first photoresist layer more soluble than prior to exposure, wherein the radiation is concentrated at about the mid-point in the thickness of the first photoresist layer;
   d) overall exposing the second photoresist layer to sufficient electron beam radiation to render the second photoresist layer more soluble than prior to exposure, wherein the radiation is concentrated at about the mid-point in the thickness of the second photoresist layer;

e) conducting either step (i), (ii) or (iii):
  (i) sequentially imagewise exposing the second photoresist layer to radiation, developing the second photoresist layer; imagewise exposing the first photoresist layer to radiation; and then developing the first photoresist layer;
  (ii) simultaneously exposing both the second and the first photoresist layers to radiation; developing the second photoresist layer; and then developing the first photoresist layer;
  (iii) sequentially imagewise exposing the second photoresist layer to radiation; imagewise exposing the first photoresist layer to radiation; and then developing the second and first photoresist layers either simultaneously or sequentially;
  to thereby form cavities in the second photoresist layer, such that the diameters of the cavities at an upper surface of the second photoresist layer are less than the diameters of the cavities at a lower surface of the second photoresist layer thus defining cavities having outwardly sloping negative sidewalls and to thereby form cavities in the first photoresist layer, such that the diameters of the cavities at an upper surface of the first photoresist layer are greater than the diameters of the cavities at a lower surface of the first photoresist layer thus defining cavities having inwardly sloping positive sidewalls.

12. The process of claim 11 wherein each imagewise exposing is conducted with actinic radiation.

13. The process of claim 11 wherein the diameters of the cavities at a lower surface of the second photoresist layer are greater than the diameters of the cavities at an upper surface of the first photoresist layer.

14. The process of claim 11 wherein the first photoresist composition comprises polymethylmethacrylate and the second photoresist composition is comprises an o-quinone diazide.

15. The process of claim 11 wherein the first photoresist composition comprises an o-quinone diazide and the second photoresist composition comprises polymethylmethacrylate.

16. The process of claim 11 wherein the substrate is selected from the group consisting of gallium arsenide, germanium, silicon, compositions containing silicon, lithium niobate and mixtures thereof.

17. The process of claim 11 wherein each the electron beam exposing is conducted at an energy level ranging from about 1 to about 30 KeV.

18. The process of claim 11 wherein each the electron beam exposing is conducted at an electron dose ranging from about 500 to about 50,000 $\mu C/cm^2$.

19. The process of claim 11 wherein the electron beam exposing is conducted with a wide, large beam of electron beam radiation from a uniform large-area electron beam source.

20. The process of 11 wherein the electron beam exposing is conducted with a wide, large beam of electron beam radiation from a uniform large-area electron beam source which covers an area of from about 4 square inches to about 256 square inches.

21. The process of claim 11 wherein the metal is selected from the group consisting of aluminum, aluminum alloys, copper, copper alloys, tantalum, tungsten and titanium.

* * * * *